United States Patent [19]

Runaldue

[11] Patent Number: 5,062,081
[45] Date of Patent: Oct. 29, 1991

[54] MULTIPORT MEMORY COLLISION/DETECTION CIRCUITRY

[75] Inventor: Thomas J. Runaldue, San Jose, Calif.

[73] Assignee: Advanced Micro Devices, Inc., Sunnyvale, Calif.

[21] Appl. No.: 419,019

[22] Filed: Oct. 10, 1989

[51] Int. Cl.[5] .......................... G11C 7/00; G11C 8/00; G11C 11/418
[52] U.S. Cl. .......................... 365/230.05; 365/230.02; 365/233.5; 365/189.04
[58] Field of Search .................. 365/230.05, 189.04, 365/189.07, 189.01, 233.5, 189.02, 230.02

[56] References Cited

U.S. PATENT DOCUMENTS

| | | | |
|---|---|---|---|
| 4,623,990 | 11/1986 | Allen et al. | 365/189.04 |
| 4,660,177 | 4/1987 | O'Connor | 365/230.05 X |
| 4,663,742 | 5/1987 | Andersen et al. | 365/189.04 |
| 4,719,596 | 1/1988 | Bernstein et al. | 365/189.04 |
| 4,742,493 | 5/1988 | Lewallen et al. | 365/233.5 |
| 4,891,788 | 1/1990 | Kreifels | 365/189.01 |

FOREIGN PATENT DOCUMENTS

| | | | |
|---|---|---|---|
| 0178163 | 4/1986 | European Pat. Off. | 365/230.05 |
| 58-130494 | 8/1983 | Japan | 365/230.05 |
| 63-183678 | 7/1988 | Japan | 365/230.05 |

Primary Examiner—Alyssa H. Bowler
Attorney, Agent, or Firm—Patrick T. King

[57] ABSTRACT

A multiport memory system is provided with a collision detection system to prevent collision between information which is simultaneously being read to a particular memory row and information being written to that same memory row simultaneously. Memory rows of the multiport memory system are independently addressed by address signals for a first port and by address signals corresponding to a second port. Row select signals are generated from the address signals of each of the ports when the row select signals for one particular memory row of the memory array are simultaneously present a match signal is generated. The match signal controls a forwarding logic circuit which connects the write port information directly to the read port when a match is present, providing immediate access to the most current information being written into the memory array. A write-strobe signal for entering information into the multiport memory array memory cells is provided for gating the match signal to provide a forward signal for the system.

7 Claims, 3 Drawing Sheets

MULTIPORT MEMORY COLLISION/DETECTION CIRCUITRY

BACKGROUND OF THE INVENTION

1. Field of the Invention.

This invention relates to multiport memories and, more particularly, to systems for resolving contention, or collisions, between two ports simultaneously addressing the same memory location.

2. Prior Art.

A problem with using multiport memory systems is memory access contention which occurs when two ports are active and each has an address which matches the other. Generically, a memory device is a circuit which stores and retrieves binary or digital information. A memory is composed of an array of memory core elements which are arranged in rows and columns. For integrated circuit memories, the size of a memory array is the product of its rows and columns.

A memory port is an access path to and from the memory core elements of a memory array. A single port memory has only one access path. An N-port memory has N access paths to the elements of the memory array. Associated with each memory access path, or port, is an address, which specifically identifies and locates the particular memory core element being accessed. For each access path, or port, there are two possible modes of operation when a path is active. These modes are a read mode and a write mode. Sometimes a memory access path is designed with just one mode available, that is, a Read Only mode. A single port memory may be operated to alternate between a Read or a Write mode. However, a single port memory must alternate between these two operational modes in a sequential fashion.

Multiport memories provide multiple access paths to the memory core elements. Each memory port operates independently from the other memory ports and accesses the memory core elements of the memory array using memory address information. Problems arise in using multiport memories when two or more memory ports attempt to access the same memory location. For example, if one of the access modes is the Write mode and the other is the Read mode, then a memory contention problem arises. If a memory core element, has changed values during a read-access period, data being read initially as a logic zero may be overwritten with a logic 1.

Integrated circuit memories require a certain amount of time to access a memory element and to obtain its value at an output terminal. In addition, time is required to write or to store information into a memory element. Frequently, the performance as measured in cycle time of a digital system is dominated by the read access time of the memory array being used. If data initially being read from the memory array is a logic zero and new data is inputted into the memory to change the value to a logic 1, then an unacceptable amount of time may be required to re-read the memory array with a new value entered into it. In the past, this memory array contention problem has been solved in two ways. The first way is to slow down the digital system using the memory to provide for the possibility that a memory cell may have to be re-read. The other way, and the most frequently used, is to provide external logic circuits which detect when a memory has an access collision and to substitute the data from the read port with the data contained at the input of the write port, where the write port is in process of writing information to the memory cell. In the first case, it often is unacceptable to read the memory cell while data is changing. The second case results in a small loss in system performance because the information at the write port is forwarded directly to the read port, bypassing the memory cell. This second way ensures that the most current data is present at the read output port, avoiding problems associated with the read data changing state during the course of a read operation.

SUMMARY OF THE INVENTION

It is an object of the invention to provide a simplified and easily integrated system for detecting collisions in a multiport memory system.

In accordance with this and other objects of the invention, a collision detection system for a multiport memory system is provided. This system prevents collision between memory information being read out of a first port of the multiport system and information being read into a second port of the multiport memory system. The multiport memory system includes a multiport memory arranged in rows and columns of memory cells. The memory cells are independently addressed by addresses for a first memory port and by addresses for a second memory port. The memory cells have associated therewith a first output port which provides as an output the information stored in the memory cell which is addressed by the first address at first address port addresses. The memory cells also have a second output which provides the information stored in memory cells as they are addressed by the second address port. A first row-select circuit decodes the memory address signals provided for the first address port, that is, for the memory read addresses. A first group of row select signals are thereby provided each of which corresponds to a row address at the first address port. A second row-select circuit is provided for decoding memory address signals provided from the second address port and this circuit provides a second group or row select signals, each corresponding to a row address of the second address port. Comparison logic is provided for comparing each of the first row select signals with the corresponding second row select signal for particular row and for providing a comparison signal. A match signal is provided from the comparison signal when one of the first row select signals is simultaneously present with this corresponding second row select signal. The match signal indicates a collision condition between a read address signal at the first port and a write address signal at the second port. A forwarding multiplexer is provided for forwarding the write input information from the second port directly to the output port of the first port when the match signal is present. This permits the data being read into the row of a memory to be directly outputted to the other port, avoiding delay due to the write information being required to be first entered into the memory cell and then read out. Thus the latest memory information is almost immediately available to the output terminals of the multiport memory array system. The multiplexer is controlled by the match signal.

According to one aspect of the invention a technique for strobing the write signals is provided. Write strobeenable signals are generated for enabling writing of information into the respective rows of the memory cells. A write-enable signal is combined in a gate with the match signal to provide a strobed match signal for activating the forwarding multiplexer.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
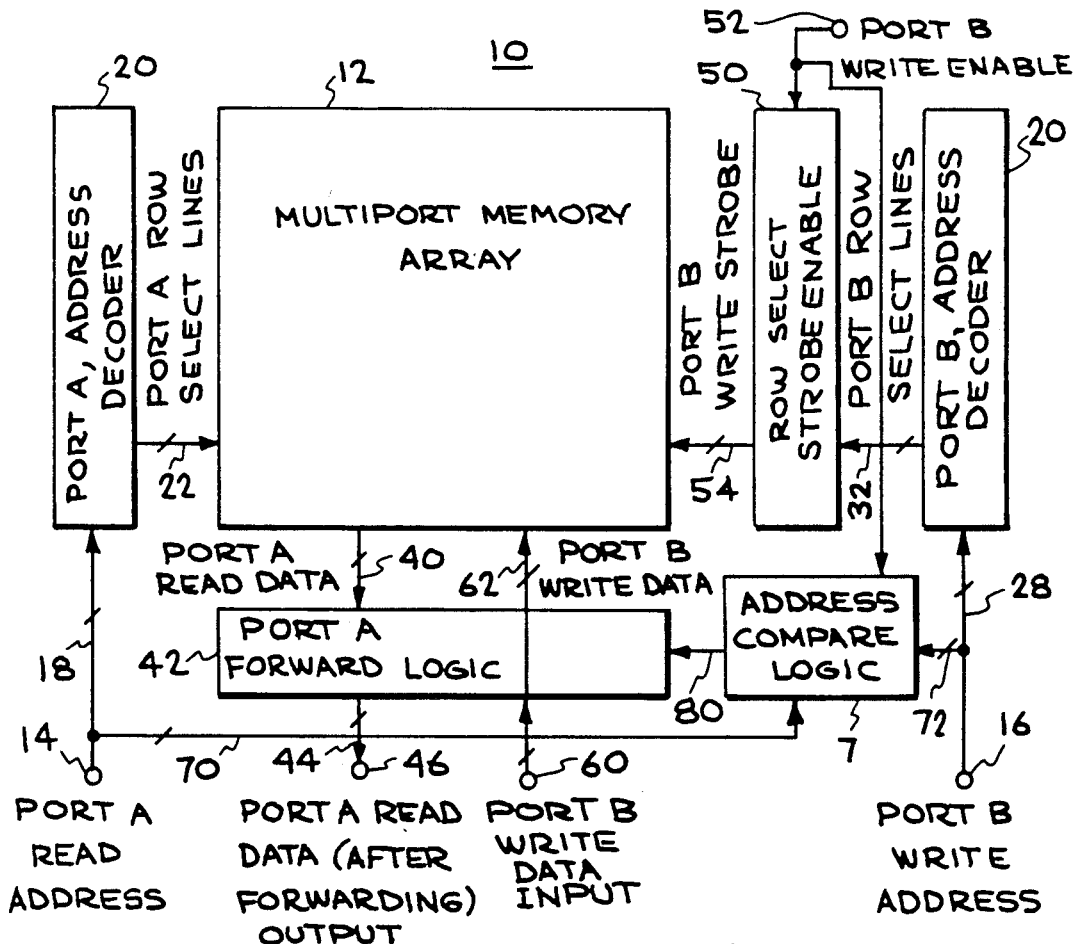
FIG. 1 is a block diagram of a conventional system for comparing a read address for a first read port of a multiport memory system to a write address for a second write port and for forwarding the write data to the read output port when a match is detected in an address-comparison circuit external to a memory.

FIG. 1 shows a prior art multiport memory system which implements address comparison for purposes of forwarding write data, or information, to a read-output port when a collision occurs between addresses for the write port and the read port. A port A read address is provided at a terminal 14 and a port B write address is provided at a terminal 16. The port A read address is coupled to a port A address decoder circuit 20, which provides an output signal, respectively, on one of the row select lines 22 corresponding to a row of the memory array 12. The particular row select line 22 selected depends on the row address which is decoded by the decoder 20. Similarly, the port B write address is coupled with address lines 28 to a port B address decoder circuit 30. Port B row select lines 32 are, respectively, each activated by a particular row address signal for the multiport memory array 12.

The port A row select lines 22 are coupled directly to the internal select lines (not shown) of the multiport memory array 12. In the read mode of operation of a multiport memory array, a memory cell can be read at any time because a read operation does not affect the value of the information contained in the memory cell. Consequently, absent a collision condition between the port A read address signal at terminal 14 and the port B write address at terminal 16, the row information selected by the port A address is provided at the port A read data output signal lines 40. This information is then passed through a forwarding logic circuit 42 to the port A read data output lines 44 and to corresponding terminals 46.

Since the write operation is a destructive operation of information already stored in the multiport memory array 12, an additional circuit is provided to control output operations to the array 12. A port B right strobe enable circuit 50 receives a port B write enable signal at a terminal 52 and the row B row select line signals on lines 32. When a port B write enable signal is present at terminal 52 the output signal from the port B right strobe enable circuit 50 provides an appropriate port B write strobe signal on one of the signal lines 54 to the multiport memory write 12. This permits port B write data at input terminals 60, which is passed through the port A forwarding logic circuit 42 to the port B write data signal line 62 and into the appropriate locations in the multiport memory array 12.

In the prior art system 10 shown in FIG. 1, the port A read address signals at terminal 14, the port B write address signals at terminal 16 and the port B write enable signal are coupled by respective signal lines 70,72,52 to the input terminals of an address compare logic circuit 74. If the two addresses coincide, along with assertion of the write enable signal, a forward signal is provided on a signal line 80 to the port A forwarding logic circuit 42. A forward signal causes the port B write data signals at terminal 60 to be directed through the port A forwarding logic circuit 42 to the output terminals 46, which normally has port A read data.

Figure 2:
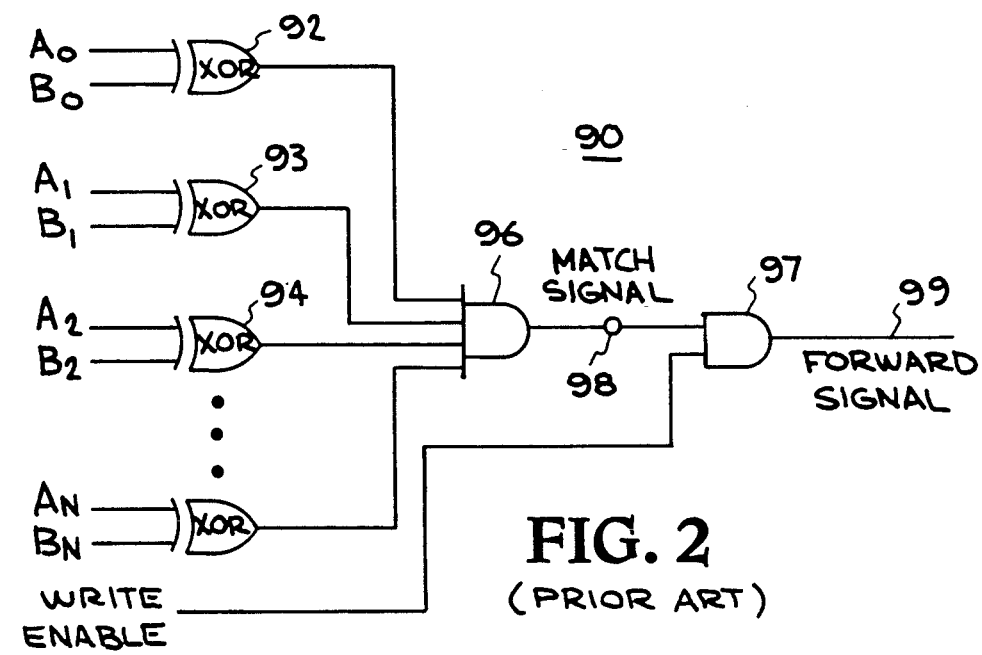
FIG. 2 is a logic circuit diagram of a conventional address comparator circuit in which corresponding bits for two address signals are compared.

FIG. 2 shows a logic circuit diagram of a conventional address comparator circuit 90 in which the individual bits of the address signals are compared in exclusive OR gates 92, 93, 94, etc. The output signals of each of these gates are connected to the input terminals of an AND gate 96. When each of the bits of the port A read address signals and of the port B write address signals are the same, a match signal is provided at the output terminal 98. An additional AND function 97 gates the match signal output terminal 98 with the Write Enable signal to provide a forward signal of the output terminal 99 of the circuit. This forward signal corresponds to the signal present on signal line 80 of FIG. 1. In practice the address comparison logic 74 is external to the multiport memory array 12 and is usually implemented as a random logic circuit design. One disadvantage of this type of design is the additional cost and assembly time for external comparison logic which is not integrated into the multiport memory array itself. The cost of providing additional signal lines for routing the address signals to and from the various circuits is significant.

The invention provides an integrated comparison system which is easily incorporated into the memory array 12 design by utilizing the row select lines available within the memory array integrated circuit.

Figure 3:
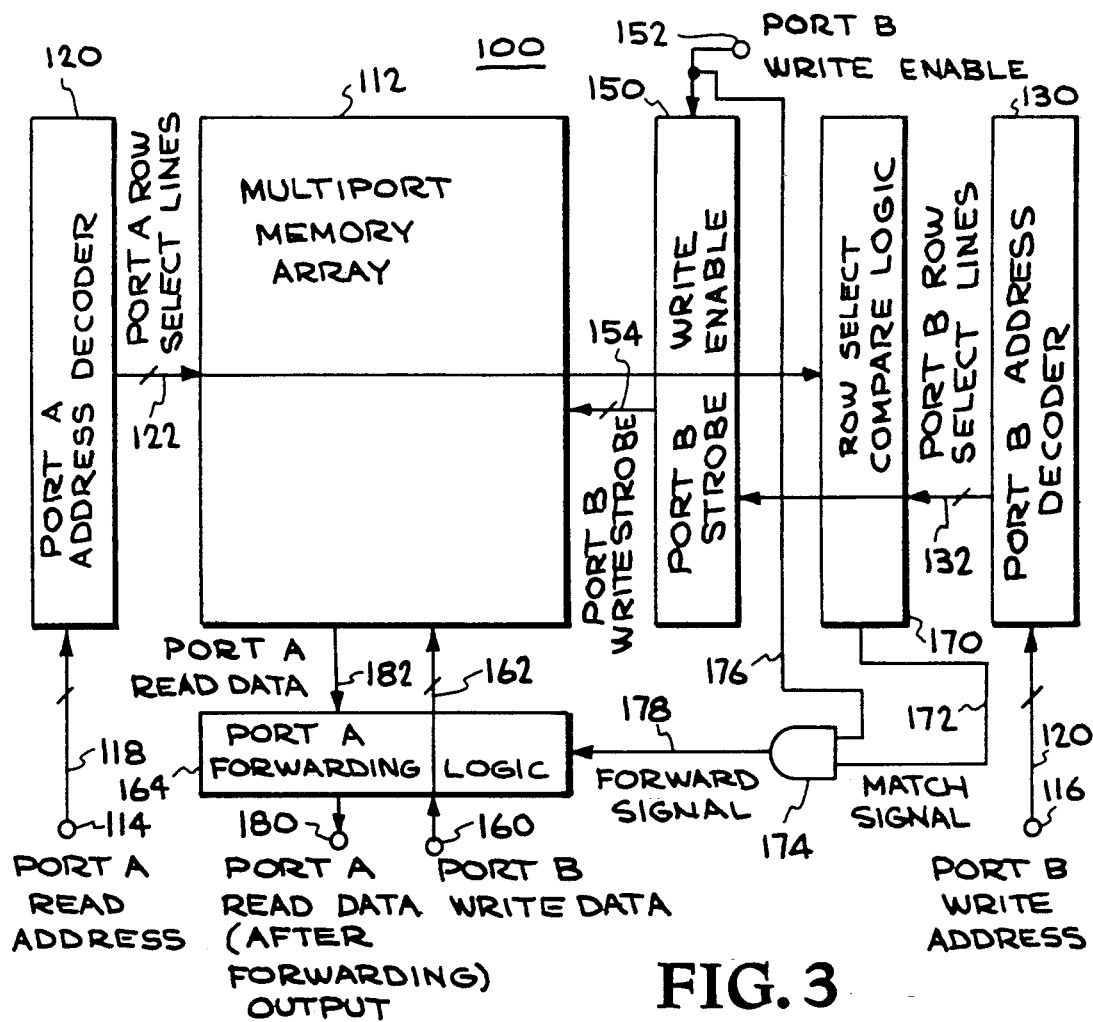
FIG. 3 is a block diagram of an integrated-circuit multiport memory system according to the invention, which, for each row, compares the internal row select signal decoded from a read port address signal with an internal row select signal decoded from a write port address signal and which forwards write data to the read output port when a match is detected.

FIG. 3 shows an integrated-circuit multiport memory system 100 according to the invention. A multiport memory array circuit 112 includes rows and columns of information. Port A read address signals are provided at a terminal 114 and coupled through signal lines 118 to a port A address decoder 120. The decoder 120 provides port A row select signals for each of the memory rows on row select lines 122. Similarly port B write address signals are provided at terminals 116 through signal lines 120 to a port B address decoder circuit 130. The decoder 130 also provides row select signals on corresponding signal lines 132. For port B the row select signals on lines 132 are further processed through a port B write strobe enable circuit 150 which receives a port B write enable signal at a terminal 152. The output signals of the strobe enable circuit 150 are coupled through respective signal lines 154 to the multiport memory array 112 as port B write strobe signals. These signals activate the memory array 112 for receiving the port B write terminal at input terminals 160. These input write data signals are coupled through signal lines 162 to the memory array 112 locations. The port B write data passes through a port A forwarding logic circuit 164, as indicated.

Figures 5, 6:
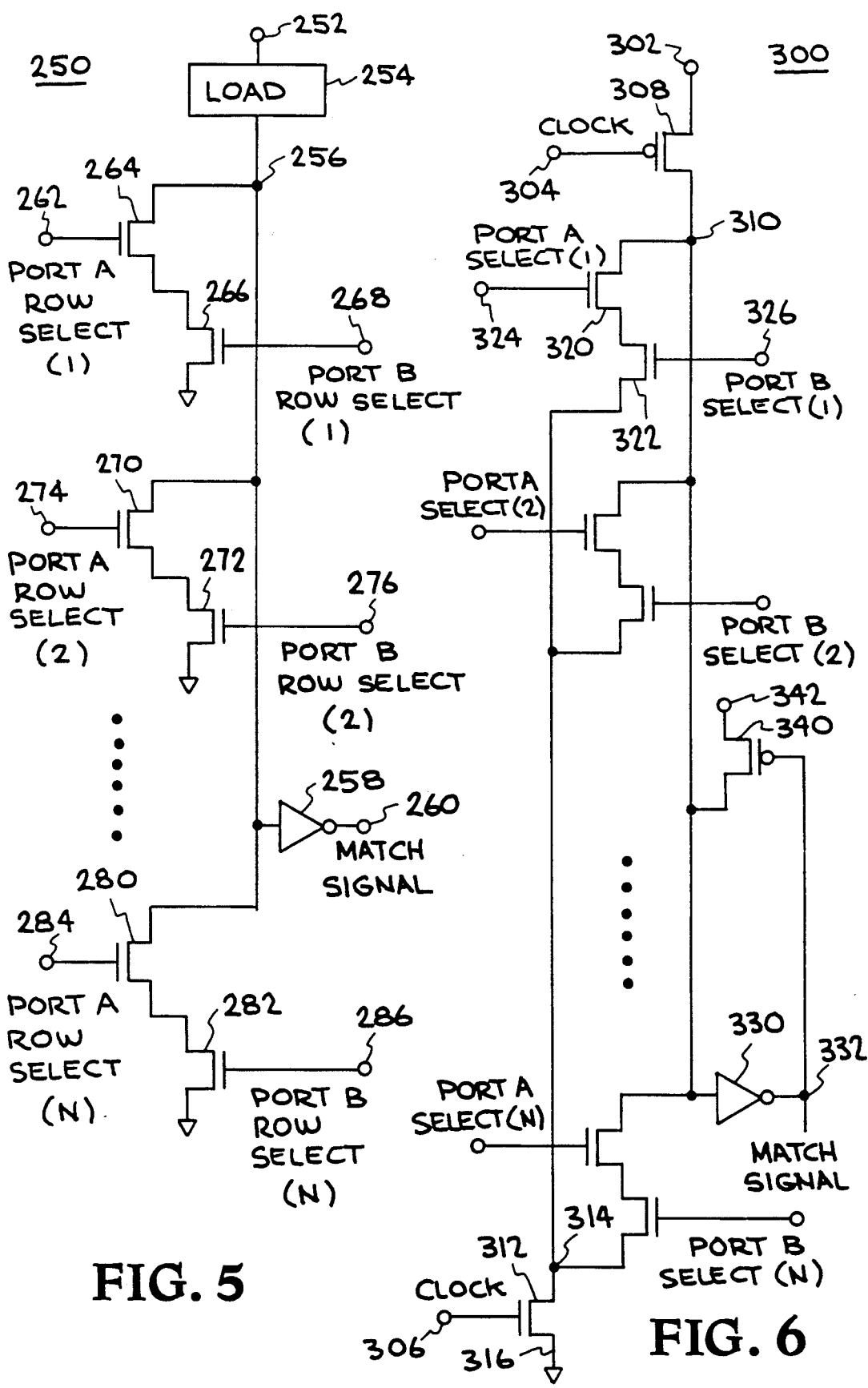
FIG. 5 is a diagram of a circuit for comparing row select signals for two ports of a multiport memory system.
FIG. 6 is a diagram of a clocked circuit for comparing row select signals for two ports of a multiport memory system.

The invention includes an row select comparison logic circuit 170. This circuit receives the port A row select signals on signal lines 122 and the port B row select signals on lines 132. Note that specific implementations of the row select comparison logic 170 are shown in FIGS. 5 and 6. The comparison logic 170 provides a match signal on the signal line 172 when anyone of the port A row select line signals is coincident with a corresponding port B row select signal. The match signal on line 172 is gated through an AND gate 174 with port B write enable signal on line 176. A forward signal is thereby provided on a signal line 178 to the input of the port A forwarding logic circuit 164. When a forward signal is active on signal line 178 the port A forwarding logic acts to forward the port B write data present at terminal 160 directly to the port A read data output terminal 180. When this occurs the port A read data information present on signal lines 182 is not passed through the forwarding logic 164 through the output terminal 180. Thus in the event of a collision between the port A read addresses and the port B write addresses as determined by comparison of their respective row select lines, the port B write data is directly forwarded to the port A read output terminal 180.

Figure 4:
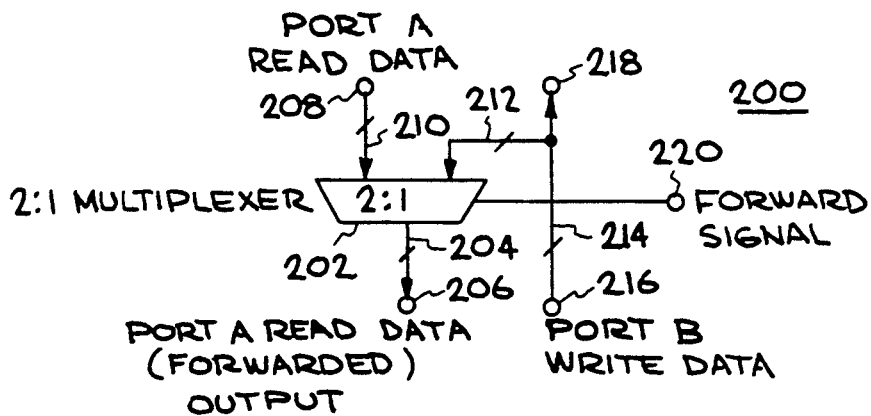
FIG. 4 is a block diagram of a forwarding logic circuit for either forwarding write data to a read port of a multiport memory system or for reading memory data to that read port.

FIG. 4 shows in more detail a forwarding logic circuit 200 such as required, for example, for the port A forwarding logic circuit 42 of FIG. 1 or the port A forwarding logic circuit 164 of FIG. 3. The circuit 200 includes a two-to-one multiplexer 202. The output signal lines 204 of the multiplexer are coupled to respective output terminals 206 as the port A read data output signals. The first input to the multiplexer 202 is the port A read data signals at terminals 208 which are coupled through the signal lines 210 to the first input to the multiplexer. The second input to the multiplexer is obtained on signal lines 212 and are the port B write data signals which are received on signal lines 214 from the port B write data terminals 216 and fed to the input terminals 218 of the multiport memory array 10 or 100. The multiplexer 202 is controlled by a forward signal which is provided at the control terminal 220 of the multiplexer. When the match signal is active the multiplexer 202 cuts off the port A read data from the multiport memory array and provides at the output terminals 206 the port B write data information. The port B write data information is therefore forwarded to the port A read data output terminals 206 for a match condition.

FIG. 5 shows a circuit 250 for statically comparing respective row select signals for port A with a corresponding row select signal for port B. Circuit includes a positive voltage power-supply terminal 252 which is connected to one terminal of a load element 254. The other end of the load element 254 is connected to a number of nodes, typically shown as 256. All of the nodes are connected to the input of an inverter 258 which provides at an output terminal 260 the match signal corresponding to the match signal present on signal line 172 of FIG. 3. When the nodes, such as 256, go to a low state, the match signal at terminal 260 goes to the High, or active, state. A port A row select signal for row 1 is provided at a terminal 262. Terminal 262 is connected to the gate terminal of a transistor 264. The drain of the transistor 264 is connected to the node 256. The source terminal of the transistor 264 is connected to the drain terminal of a transistor 266. The port B row select signal for row 1 is connected to a terminal 268 connected to the gate of the transistor 266. The source terminal of the transistor 266 is connected to a ground, or low, terminal 270. The transistors 264,266 are turned on when the signals are terminals 262,268 are in the High state. When both the port A row select signal for row 1 and the port B row select signal for row 1 are both active, both of the transistors 264,266 are turned on to provide a low impedance connection between the node 256 and the ground terminal 270. This activates the inverter 258 to provide an active match signal at output terminal 260. Similarly, the other pairs of transistors 270,272 for the row 2 row select signals at terminals 274,276 activate the match signal at terminal 260 when a row select signal for port A and row select signal for port B are both simultaneously present. This scheme of transistor pairs is provided for each of the row select input signals and ends with the transistor pair 280,282 having as inputs the port A row select signal for the NTH row at terminal 284 and the port B row select signal for the NTH row at terminal 286.

FIG. 6 shows a comparator circuit 300 which is utilized to reduce current drain from a positive voltage power supply connected to a terminal 302. A clock signal is provided at a terminal 304 and at a terminal 306. The clock signal at terminal 304 is connected to the gate terminal of a P-channel transistor 308, which has its source connected to terminal positive voltage terminal 302, which has its drain connected to a terminal 310. When the clock signal at terminal 304 is in the LOW state the transistor 308 is in the ON state. When the clock signal at terminal 304 is in the HIGH state, the transistor 308 is in the OFF, or HIGH impedance state.

The clock signal at terminal 306 is connected to the gate terminal of an N-channel transistor 312. The drain of the transistor 312 is connected to a terminal 314 and the source of the transistor 312 is connected to a ground terminal 316 as shown. When the clock signal at terminal 306 is in the HIGH state, the transistor 312 is turned on to a LOW impedance state. When the clock at the terminal 306 is in the LOW state, the transistor 312 is in the OFF, or HIGH impedance, state. Consequently the transistors 308,312 are in opposite states, dependent on the state of the clock signal. The transistor 308 provides a LOW impedance connection for the positive voltage at terminal 302 to the node 310 while the transistor 312 provides a LOW impedance connection between the terminal 314 and the ground terminal 316. A pair of transistors, typically represented by transistors 320,322 provide for a LOW impedance connection between terminal 310 and terminal 314. The port A row select signal for row 1 is connected to terminal 324 and the port B row select signal for row 1 is connected to terminal 326. Both transistors 320,322 are N-channel types so that when the port A row select signal and the port B row select signal for row 1 are HIGH, or active, the transistors 320,322 are turned ON to provide a LOW impedance connection between terminal 310 and terminal 314. When transistor 312 is turned ON, terminal 314 is grounded and terminal 310 goes to a LOW state, a LOW state at 310 causes the inverter 330 to provide a HIGH, or ACTIVE, output signal at the match signal output terminal 332.

A P-channel transistor 340 provides a LOW impedance path for a current between a positive voltage terminal 342 and the node 310 when the match signal at terminal 332 is in the LOW state. This maintains terminal 310 at a high state particularly when the clock signals at terminals 304,306 are operated at a LOW frequency rate. The P-channel transistor 340 is sized to provide a higher impedance path to positive terminal 342 than the series impedance paths for transistors 312,332,320 or any other possible conduction path from terminal 316 to node 310. The advantage of using the circuit 300 is that it saves power.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A collision detection system for a multiport memory system, said detection system preventing collision between read information being outputted at a first input/output port from a row of memory cells while write input information is simultaneously being inputted to the same row of memory cells from a second inputoutput port, comprising:

a multiport memory arranged as rows and columns of memory cells, said memory cells being independently addressed by a first address port and by a second address port, said memory cells having a first input/output port providing the information stored in memory cells addressed by the first address port; said memory cells having a second input/output port providing the information stored in memory cells addressed by the second address port;

first row-select means for decoding binary memory address signals provided at said first address port and for providing a first group of row select signals, each of which row-select signals corresponds to a decoded binary row address at the first address port;

second row-select means for decoding binary memory address signals provided at said second address port and for providing a second group of row select signals, each of which row-select signals corresponds to a decoded binary row address at the second address port;

comparison means for comparing said first row select signals with said second row select signals, said comparison means providing a match signal when one of the first row select signals is simultaneously present with a corresponding second row select signal, said match signal indicating a collision condition between corresponding row select signals;

means for forwarding write input information from the second input/output port directly to the first input/output port when said match signal is present and when corresponding row select signals are simultaneously present.

2. The system of claim 1 wherein the means for forwarding includes multiplexer means, having output terminals coupled to the first input/output port, for selecting between the read information from one of the rows of memory cells or the write input information from the second input/output port, said multiplexer means being controlled by said match signal.

3. The system of claim 1 including:

write strobe-enable means for producing write-strobe signals for enabling writing of information into respective rows of memory cells, said write strobe enable means receiving row-select means, AND gate means for logically combining each of said row-select signals with a write-enable signal to reproduce respective write-strobe signals for each row of memory cells.

4. The system of claim 1 including gate means for combining the match signal with a write-enable signal to activate the means for forwarding write input data when the writeenable signal is active.

5. The system of claim 1 including:

write strobe-enable means for producing write-strobe signals for enabling writing of information into respective rows of memory cells, said write strobe enable means receiving the second group of row-select signals from the second row-select means, AND gate means for logically combining each of said row-select signals with a write-enable signal to produce respective write-strobe signals for each row of memory cells.

6. A collision detection system for a multiport memory system, said detection system preventing collision between read information being outputted at a first input/output port from a row of memory cells while other write input information is being simultaneously being inputted to the same row of memory cells from a second input/output port, comprising:

a multiport memory arranged as rows and columns of memory cells, aid memory cells being independently addressed by a first address port and by a second address port;

first row-select means for decoding binary memory address signals provided at said first address port and for providing a first group of row select signals, each of which corresponds to a row address at the first address port;

second row-select means for decoding binary memory address signals provided at said second address port and for providing a second group of row select signals, each of which corresponds to a row address at the second address port;

comparison means for comparing said first row select signals with said second row select signals, said comparison means providing a match signal when one of the first row select signals is simultaneously present with a corresponding second row select signal, said match signal indicating a collision condition between information being outputted from said first input/output port and information being inputted to said second input/output port.

7. The system of claim 5 including gate means for combining the match signal with a write-enable signal to provide a gated match signal.

* * * * *